(12) United States Patent
Litton et al.

(10) Patent No.: US 8,343,587 B2
(45) Date of Patent: Jan. 1, 2013

(54) PROCESS OF FORMING DURABLE REACTIVE THERMAL BARRIER COATINGS

(75) Inventors: David A. Litton, West Hartford, CT (US); Kevin W. Schlichting, South Glastonbury, CT (US); Melvin Freling, West Hartford, CT (US); John G. Smeggil, Simsbury, CT (US); David B. Snow, Glastonbury, CT (US); Michael J. Maloney, Marlborough, CT (US)

(73) Assignee: United Technologies Corporation, Hartford, CT (US)

( * ) Notice: Subject to any disclaimer, the term of this patent is extended or adjusted under 35 U.S.C. 154(b) by 129 days.

(21) Appl. No.: 12/641,521

(22) Filed: Dec. 18, 2009

(65) Prior Publication Data

US 2010/0098865 A1 Apr. 22, 2010

Related U.S. Application Data

(62) Division of application No. 11/336,437, filed on Jan. 20, 2006, now Pat. No. 7,662,489.

(51) Int. Cl.
*B05D 5/00* (2006.01)
(52) U.S. Cl. ................................. 427/419.3
(58) Field of Classification Search .......... 427/553, 427/446, 449, 453, 454, 255.28, 255.31, 427/255.36, 508, 407.1, 409, 419.1, 419.2, 427/419.3
See application file for complete search history.

(56) References Cited

U.S. PATENT DOCUMENTS

| 6,025,078 | A | 2/2000 | Rickerby et al. |
| 6,177,200 | B1 | 1/2001 | Maloney |
| 6,261,643 | B1 | 7/2001 | Hasz et al. |
| 6,284,323 | B1 | 9/2001 | Maloney |
| 6,440,575 | B1 * | 8/2002 | Heimberg et al. ............ 428/472 |
| 6,812,176 | B1 | 11/2004 | Zhu et al. |
| 6,835,465 | B2 | 12/2004 | Allen et al. |
| 6,875,529 | B1 | 4/2005 | Spitsberg et al. |
| 2002/0028344 | A1 | 3/2002 | Beele |
| 2003/0008764 | A1 | 1/2003 | Wang et al. |
| 2007/0160859 | A1 * | 7/2007 | Darolia et al. ................ 428/469 |

FOREIGN PATENT DOCUMENTS

| CN | 1253878 A | 5/2000 |
| EP | 0825271 A1 | 2/1998 |
| EP | 1400611 A1 | 3/2004 |
| EP | 1806423 A1 | 7/2007 |

OTHER PUBLICATIONS

Bansal et al., "Effects of Doping on Thermal Conductivity of Pyrochlore Oxides for Advanced Thermal Barrier Coatings," NASA/TM—2006-214483, Dec. 2006, 14 pages.*

* cited by examiner

*Primary Examiner* — William Phillip Fletcher, III
(74) *Attorney, Agent, or Firm* — Bachman & LaPointe, P.C.

(57) ABSTRACT

A method for providing a component with protection against sand related distress comprises the steps of: providing a substrate; and forming a thermal barrier coating system by depositing at least one layer of a first material selected from the group consisting of a zirconate, a hafnate, a titanate, and mixtures thereof, which first material has been mixed with at least one oxide so that each layer contains from about 25 to 99 wt% of at least one oxide.

20 Claims, 1 Drawing Sheet

PROCESS OF FORMING DURABLE REACTIVE THERMAL BARRIER COATINGS

CROSS REFERENCE TO RELATED APPLICATION(S)

This application is a divisional application of allowed U.S. patent application Ser. No. 11/336,437, filed Jan. 20, 2006, entitled DURABLE REACIVE THERMAL BARRIER COATINGS, now U.S. Pat. No. 7,662,489.

BACKGROUND OF THE INVENTION (1) Field of the Invention

The present invention relates to a thermal barrier coating materials that react with deposits on the thermal barrier coatings during service in a turbine engine to form a nearly impermeable barrier phase at or near the interface between the thermal barrier coating and the deposits, to a method for forming a thermal barrier coating, and to a turbine engine component having the thermal barrier coating.

(2) Prior Art

The degradation of turbine airfoils due to sand related distress of thermal barrier coatings is a significant concern with all turbine engines used in a desert environment. This type of distress can cause engines to be taken out of operation for significant repairs.

Sand related distress is caused by the penetration of fluid sand deposits into the thermal barrier coatings which leads to spallation and accelerated oxidation of any exposed metal.

SUMMARY OF THE INVENTION

In accordance with the present invention, there is provided a thermal barrier coating system which reduces sand related distress on turbine engine components. The thermal barrier coating system broadly comprises a material selected from the group consisting of a zirconate, a hafnate, a titanate, and mixtures thereof, which material has been mixed such that it contains about 25-99 wt % of at least one oxide.

Further in accordance with the present invention, a turbine engine component is provided which broadly comprises a substrate and a thermal barrier coating comprising a material selected from the group consisting of a zirconate, a hafnate, a titanate, and mixtures thereof, which material has been doped with from about 20-100 wt % of at least one oxide.

Still further in accordance with the present invention, a method for forming a coating system which reduces sand related distress is provided. The method broadly comprises the steps of providing a substrate, depositing a material selected from the group consisting of a zirconate, a hafnate, a titanate, and mixtures thereof, which material has been doped with from about 20-100 wt % of at least one oxide onto the substrate.

Other details of the durable reactive thermal barrier coatings of the present invention, as well as other objects and advantages attendant thereto, are set forth in the following detailed description and the accompanying drawing wherein like reference numerals depict like elements.

DETAILED DESCRIPTION OF THE PREFERRED EMBODIMENT(S)

It has been discovered that certain coatings react with fluid sand deposits and a reaction product forms that inhibits fluid sand penetration into the coating. The reaction product has been identified as being a silicate oxyapatite/garnet containing primarily gadolinia, calcia, zirconia, and silica. The present invention relates to a coating system for a component, such as a turbine engine component, which takes advantage of this discovery.

Figure 1:
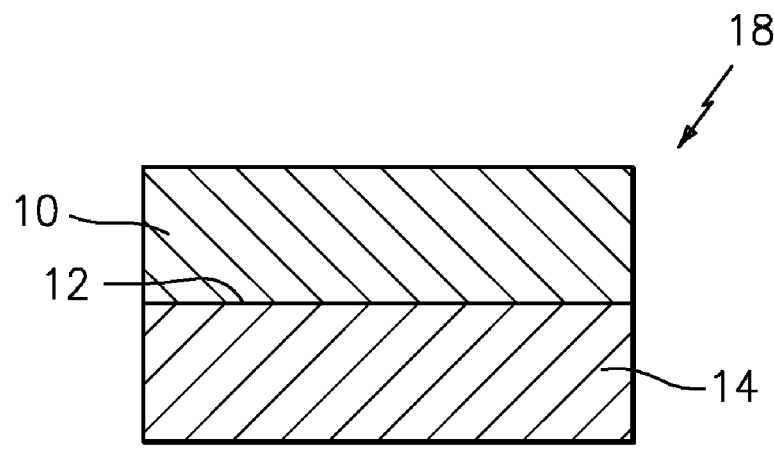
FIG. 1 is a schematic representation of a turbine engine component with the coating of the present invention.

In accordance with the present invention, referring now to FIG. 1, the coating system 18 of the present invention includes at least one layer of a material selected from the group consisting of a zirconate, a hafnate, a titanate, and mixtures thereof, which material has been doped with from about 25-100 wt % of at least one oxide. In order to form the coating system 18, at least one layer 10 of a material selected from the group consisting of a zirconate, a hafnate, a titanate, and mixtures thereof, is applied to a surface 12 of a substrate 14, such as a turbine engine component including, but not limited to, a blade or a vane. Materials which can be used to form each layer 10 include, but are not limited to, gadolinium zirconate, lanthanum zirconate, neodymium titanate, and gadolinium hafnate. The material in each layer 10 is mixed with, and preferably contains, from about 25 to 99 wt %, preferably from about 40-70 wt %, of at least one oxide of a metal selected from the group consisting of lanthanum, cerium, praseodymium, neodymium, promethium, samarium, europium, gadolinium, terbium, dysprosium, holmium, erbium, thulium, ytterbium, lutetium, scandium, indium, and yttrium. For example, the at least one oxide could be a sesquioxide of one of the aforementioned rare earth elements.

The substrate 14 may be formed from any suitable material such as a nickel based superalloy, a cobalt based alloy, a moldybdenum based alloy, or a titanium based alloy.

Each layer 10 may be applied by, for example, electron beam physical vapor deposition (EB-PVD) or air plasma spray. Other methods which can be used to deposit each layer 10 includes, but is not limited to, sol-gel techniques, slurry techniques, sputtering techniques, chemical vapor deposition techniques, HVOF, and UV curable resin techniques.

A preferred process for performing the deposition of each layer 10 is EB-PVD. When performing this process, the substrate 14 may be placed in a coating chamber and heated to a temperature in the range of from 1700 to 2000 degrees Fahrenheit. The coating chamber may be maintained at a pressure in the range of from 0.05 to 2.0 millitorrs. The feedstock feed rate may be from 0.3 to 2.0 inches/hour. The coating time may be in the range of from 20 to 120 minutes.

Each deposited layer 10 may have a thickness of from about 1.0 to 50 mils, preferably from about 1.0 to 15 mils.

The layer(s) 10 of the thermal barrier coating material in accordance with the present invention will react with molten sand deposits and form a barrier phase of oxyapatite and/or garnet to resist further penetration.

The coating system of the present invention is an advantageous thermal barrier coating system that resists the penetration of molten silicate material. The coating system provides enhanced durability in environments where sand induced distress of turbine airfoils occurs.

Figure 2:
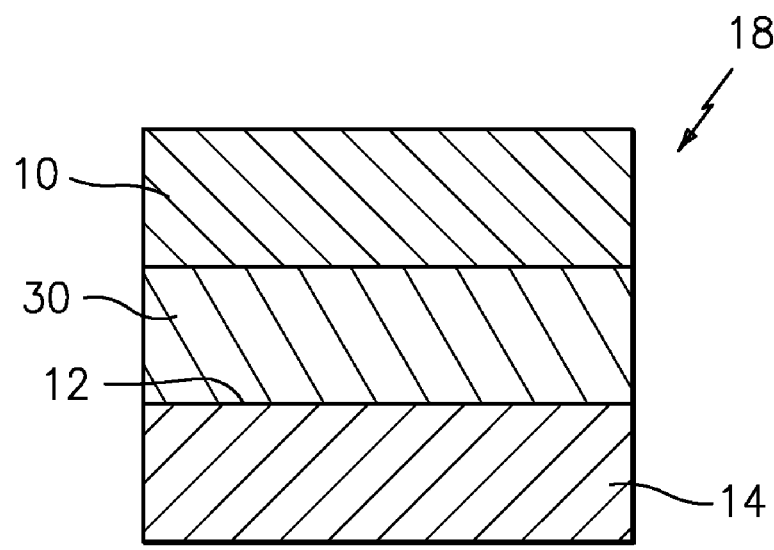
FIG. 2 is a schematic representation of a turbine engine component with an alternative coating system in accordance with the present invention.

Referring now to FIG. 2, if desired, a metallic bond coat 30 may be deposited onto the substrate 14 to bond the substrate 14 to the layer 10. The metallic bond coat 30 may be a MCrAlY bond coat where M is at least one of nickel, cobalt, and iron. Alternatively, the metallic bond coat 30 may be an aluminide or platinum aluminide bond coat. The bond coat 30 may have a thickness in the range of from about 0.5 to 20 mils, preferably from about 0.5 to 10 mils. The bond coat 30 may be deposited by a low pressure plasma spray, HVOF (high velocity oxygen fuel), a cathodic arc process, a diffusion process, an air plasma spray process, or a plating process, as well as by any process which is capable of forming a dense uniform metallic structure.

It is apparent that there has been provided in accordance with the present invention a durable reactive thermal barrier coating which fully satisfies the objects, means, and advantages set forth hereinbefore. While the present invention has been described in the context of specific embodiments, other unforeseeable alternatives, modifications, and variations may become apparent to those skilled in the art having read the foregoing description. Accordingly, it is intended to embrace those alternatives, modifications, and variations which fall within the broad scope of the appended claims.

What is claimed is:

1. A method for providing a component with protection against sand related distress comprising the steps of:
   providing a substrate;
   forming a thermal barrier coating system by depositing at least one layer of a first material selected from the group consisting of a zirconate, a hafnate, a titanate, and mixtures thereof, which first material has been mixed with at least one oxide so that each said layer contains from about 25 to 99 wt% of said at least one oxide,
   wherein said depositing step further comprises selecting said at least one oxide from at least one oxide of a material selected from the group consisting of lanthanum, cerium, praseodymium, neodymium, promethium, samarium, europium, gadolinium, terbium, dysprosium, holmium, erbium, thulium, ytterbium, lutetium, scandium, indium, and yttrium and mixing said first material with said at least one selected oxide.

2. The method according to claim 1, wherein said depositing step comprises depositing at least one layer of said first material, which first material has been doped with from about 40 wt% to 70 wt% of said at least one oxide.

3. The method according to claim 1, wherein said depositing step comprises depositing each said layer to a thickness in the range of from about 1.0 to 50 mils.

4. The method according to claim 1, wherein said depositing step comprises depositing each said layer to a thickness in the range of from about 1.0 to 15 mils.

5. The method according to claim 1, wherein said substrate providing step comprises providing a substrate formed from a material selected from the group consisting of a nickel based alloy, a cobalt based alloy, and a molybdenum based alloy.

6. The method according to claim 1, further comprising depositing a metallic bond coat layer between said substrate and said thermal barrier coating system.

7. A method for providing a component with protection against sand related distress comprising the steps of:
   providing a substrate;
   forming a thermal barrier coating system by depositing at least one layer of a first material selected from the group consisting of a zirconate, a hafnate, a titanate, and mixtures thereof, which first material has been mixed with at least one oxide so that each said layer contains from about 25 to 99 wt% of said at least one oxide,
   wherein said depositing step comprises depositing a material selected from the group consisting of gadolinium zirconate, lanthanum zirconate, neodymium titanate, and gadolinium hafnate.

8. The method according to claim 7, wherein said depositing step further comprises selecting said at least one oxide from at least one oxide of a material selected from the group consisting of lanthanum, cerium, praseodymium, neodymium, promethium, samarium, europium, gadolinium, terbium, dysprosium, holmium, erbium, thulium, ytterbium, lutetium, scandium, indium, and yttrium and mixing said first material with said at least one selected oxide.

9. The method according to claim 7, wherein said depositing step comprises depositing at least one layer of said first material, which first material has been doped with from about 40 wt% to 70 wt% of said at least one oxide.

10. The method according to claim 7, wherein said depositing step comprises depositing each said layer to a thickness in the range of from about 1.0 to 50 mils.

11. The method according to claim 7, wherein said depositing step comprises depositing each said layer to a thickness in the range of from about 1.0 to 15 mils.

12. The method according to claim 7, wherein said substrate providing step comprises providing a substrate formed from a material selected from the group consisting of a nickel based alloy, a cobalt based alloy, and a molybdenum based alloy.

13. The method according to claim 7, further comprising depositing a metallic bond coat layer between said substrate and said thermal barrier coating system.

14. A method for providing a component with protection against sand related distress comprising the steps of:
   providing a substrate;
   placing said substrate into a coating chamber;
   heating said substrate in said coating chamber to a temperature in the range of from 1700° F. to 2000° F.;
   maintaining pressure in said coating chamber at a pressure in the range of from 0.05 to 2.0 millitorrs; and
   forming a thermal barrier coating system by depositing at least one layer of a first material selected from the group consisting of a zirconate, a hafnate, a titanate, and mixtures thereof, which first material has been mixed with at least one oxide so that each said layer contains from about to 25 to 99 wt% of said at least one oxide.

15. The method according to claim 14, wherein said depositing step comprises depositing at least one layer of said first material, which first material has been doped with from about 40 wt% to 70 wt% of said at least one oxide.

16. The method according to claim 14, wherein said depositing step comprises depositing each said layer to a thickness in the range of from about 1.0 to 50 mils.

17. The method according to claim 14, wherein said depositing step comprises depositing each said layer to a thickness in the range of from about 1.0 to 15 mils.

18. The method according to claim 14, wherein said substrate providing step comprises providing a substrate formed from a material selected from the group consisting of a nickel based alloy, a cobalt based alloy, and a molybdenum based alloy.

19. The method according to claim 14, further comprising depositing a metallic bond coat layer between said substrate and said thermal barrier coating system.

20. The method according to claim 14, wherein said depositing step further comprises selecting said at least one oxide from at least one oxide of a material selected from the group consisting of lanthanum, cerium, praseodymium, neodymium, promethium, samarium, europium, gadolinium, terbium, dysprosium, holmium, erbium, thulium, ytterbium, lutetium, scandium, indium, and yttrium and mixing said first material with said at least one selected oxide.

* * * * *